(12) United States Patent
Rezende et al.

(10) Patent No.: US 6,184,514 B1
(45) Date of Patent: Feb. 6, 2001

(54) PLASTIC COVER FOR IMAGE SENSORS

(75) Inventors: Carlos F. Rezende, Rochester; Craig E. Arnold, Brockport; Mark A. Harland, Hilton, all of NY (US)

(73) Assignee: Eastman Kodak Company, Rochester, NY (US)

( * ) Notice: Under 35 U.S.C. 154(b), the term of this patent shall be extended for 0 days.

(21) Appl. No.: 09/215,530

(22) Filed: Dec. 18, 1998

(51) Int. Cl.⁷ .................. H01L 31/0203; H01L 27/00
(52) U.S. Cl. .................. 250/208.1; 250/239; 257/434
(58) Field of Search .................. 250/208.1, 239, 250/216, 237 R; 257/431, 432, 433, 434, 435; 358/482, 483

(56) References Cited

U.S. PATENT DOCUMENTS

| | | |
|---|---|---|
| 5,310,076 | 5/1994 | Burton et al. . |
| 5,400,915 | 3/1995 | Kennedy . |
| 5,603,410 | 2/1997 | Kara . |
| 5,782,370 | 7/1998 | Kamiya . |
| 5,861,654 | * 1/1999 | Johnson ............... 250/208.1 |

* cited by examiner

*Primary Examiner*—John R. Lee
*Assistant Examiner*—Kevin Pyo
(74) *Attorney, Agent, or Firm*—Frank Pincelli

(57) ABSTRACT

A cover and method of protecting and testing an image sensor. The cover is designed to be mounted on a supporting substrate in which the sensor is mounted. The substrate has a generally planer surface with the image sensor being mounted below the generally planer surface. Cover includes a body portion which extends over the image sensor and has means for removably mounting and demounting the cover from the substrate. The cover further includes a window area such that use and/or test of said sensor may occur through said window when the cover is mounted to said substrate.

26 Claims, 4 Drawing Sheets

PLASTIC COVER FOR IMAGE SENSORS

FIELD OF THE INVENTION

The present invention relates to covers for protecting image sensors, and more particularly, to a plastic cover for use in covering an area CCD array.

BACKGROUND OF THE INVENTION

A typical prior art sensor is provided in a supporting substrate such that the image sensor is positioned below the top surface of the substrate. The substrate includes a plurality of connecting leads which are used to electrically connect the image sensor to a circuit board as is done in the prior art with other electrical components. Typical image sensors are often area charge couple devices which are very expensive, sensitive to particles, and susceptible to damage. It is essential with CCDs to conduct preliminary tests on the image sensor prior to installation. Often, it is necessary to run a final test after the image sensor is installed in a product. In order to protect the CCD from particles and minimize any potential damage to the image sensor, a clear cover glass is usually placed directly over the substrate. The cover glass is typically provided with a fillet of epoxy placed around its perimeter. Image sensors are available to customers with permanent or temporary cover glass. Devices with permanent cover glass loses some light due to the reflection and transmission of the glass. The amount of light loss depends on the index of refraction of the glass material. In contrary, devices with temporary cover glass does not have this problem. Temporary cover glass is removed after testing and final installation of the image sensor. The substrate is bonded directly to the fiber bundle optics of the product allowing a very tight clearance between the lens optics and the CCD. Although, permanent-sealing covers loses more light than devices without covers, they provide a better moisture barrier and particle protection to the image sensor. It is up to the customer to decide whether a permanent or temporary cover will better fit their product. When it is desired to provide a permanent seal, then the epoxy side of the glass cover is placed directly against the top surface of the substrate. When it is desired to provide a temporary cover, then the covered glass is placed on the substrate such that the epoxy is facing upward and the tape is used to hold the cover glass to the substrate during testing. If it is desired to permanently retain the glass cover on the substrate, the cover must be cured in an oven which introduces additional cost and expense. When the cover glass is to be temporarily mounted to the substrate an adhesive tape is used to secure the cover glass to the substrate. However, the adhesive tape presents a problem in that it leaves a residue on the ceramic substrate. Additionally, the tape may also leave particles upon the substrate that could potentially fall on the top of the image sensor. In addition, the process of applying the tape in securing the cover glass can be a tedious and time consuming operation. A further problem with prior art cover glass is that when the temporary cover glass is secured onto the substrate, if it is damaged or the optical property is substantially reduced due to particles, there is relatively a tedious and expensive process to remove the temporary cover glass. Defects and particles on the CCD are detected during standard production test and final product test. If particles are found on devices with the temporary cover glass, then the lid must be removed in order to clean the particles. If the problem is fixed, then the temporary cover must be reattached to the substrate. However, if the cover glass is contaminated with particles or scratches, a new temporary cover must be used for the device.

Thus, there is a need to provide an improved temporary cover glass that is inexpensive, can be easily changed in the event of defects or particles, and/or may be easily removed after testing the sensor. It is also desirable to provide a process which minimizes the amount of labor necessary for providing of the cover glass.

SUMMARY OF THE INVENTION

The present invention is directed to overcoming one or more of the problems set forth above. Briefly summarized according to one aspect of the present invention, there is provided a cover for protecting an image sensor mounted on a supporting substrate, the substrate having a generally planer surface, the image sensor being mounted below the generally planer surface, the cover comprising:

a body extending over the image sensor and having means for removably mounting and demounting the cover from the substrate, the body having a window area such that use and/or test of said sensor may occur through said window when the cover is mounted to said substrate.

In accordance with another aspect of the present invention there is provided a sensor and cover assembly comprising sensor having a supporting substrate having a generally planer upper surface and an image sensor mounted to the substrate below the upper surface, and a cover for positioning on the upper surface for protection of the image sensor, the cover comprising:

a body extending over the image sensor and having means for removably mounting and demounting the cover from the substrate, the body having a window area such that use and/or test of said sensor may occur through said window when the cover is mounted to said substrate.

In accordance with yet another aspect of the present invention there is provide a method of testing an image sensor provided in a supporting substrate, comprising:

providing a supporting substrate having a general planer upper surface and an image sensor mounted to the supporting substrate below the upper surface;

providing a removable cover for engagement with the supporting substrate, the lid extending over the image sensor, the cover having a body having a window such that use and/or test of said sensor may occur through said window when the cover is mounted to said substrate; and subjecting the image sensor to optical testing through the window.

The above, and other objects, advantages and novel features of the present invention will become more apparent from the accompanying detailed description thereof when considered in conjunction with the following drawings.

BRIEF DESCRIPTION OF THE DRAWINGS

In the detailed description of the preferred embodiments of the invention presented below, reference is made to the accompanying drawings in which.

DETAILED DESCRIPTION OF THE INVENTION

Figure 1:
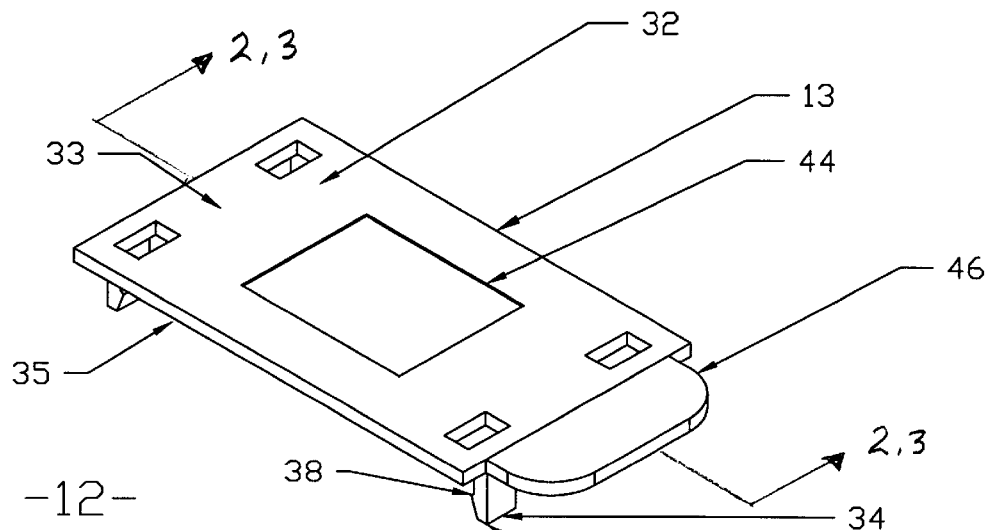
FIG. 1 is an exploded view of a sensor assembly and cover made in accordance with present invention.
Figure 1:
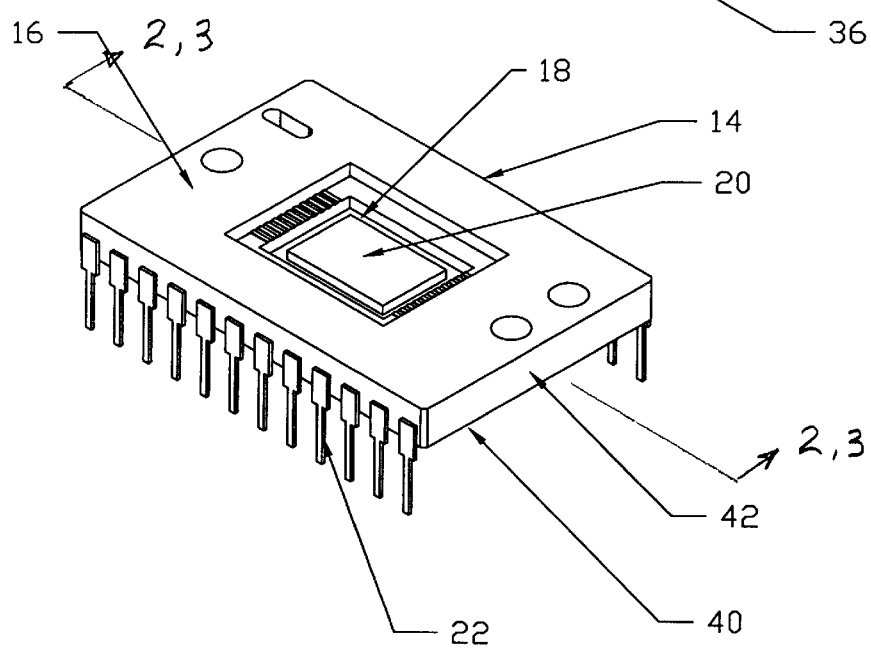
Figure 2:
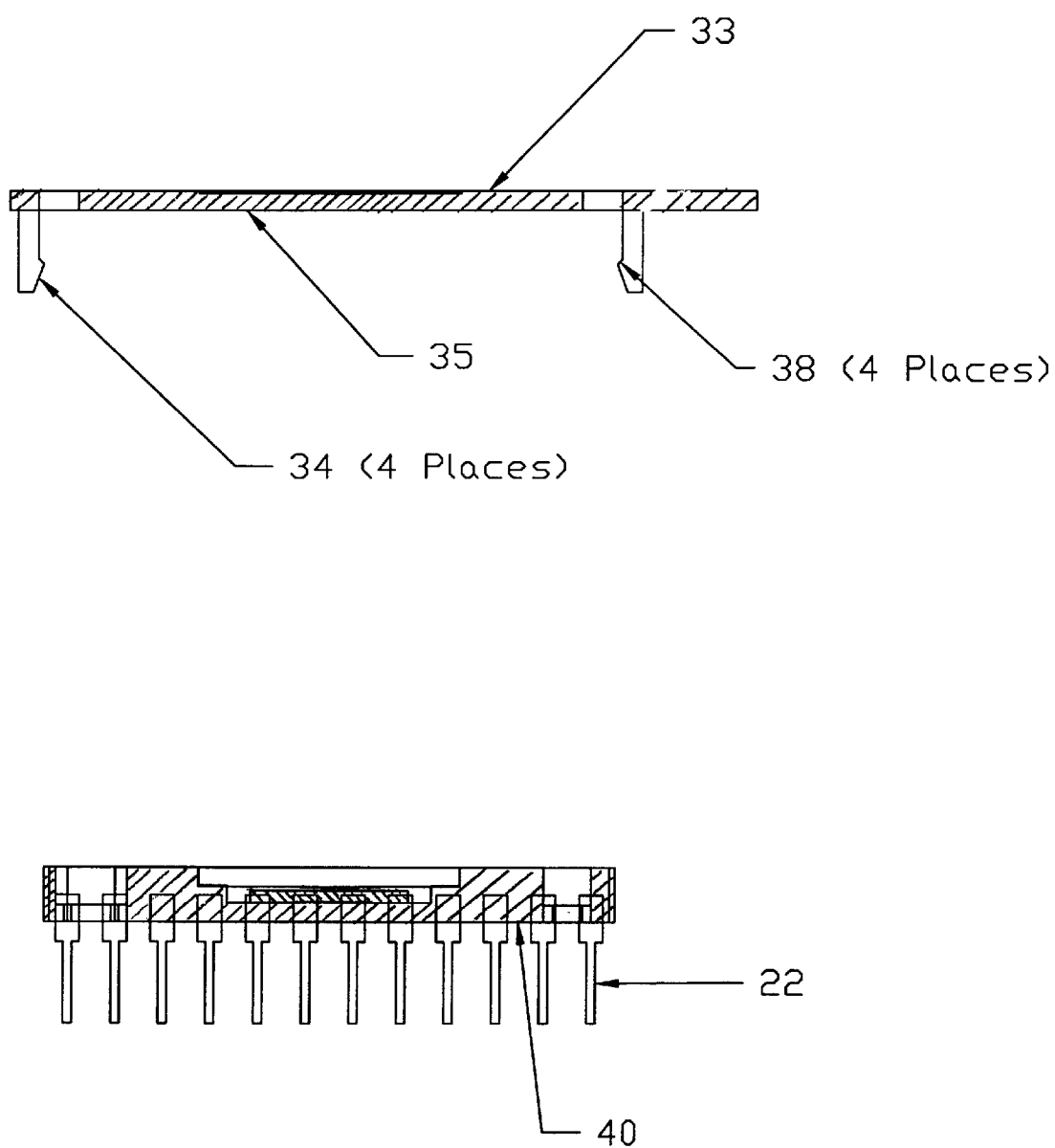
FIG. 2 is a cross-sectional view of the assembly of FIG. 1 as taken along line 2—2.
Figure 3:
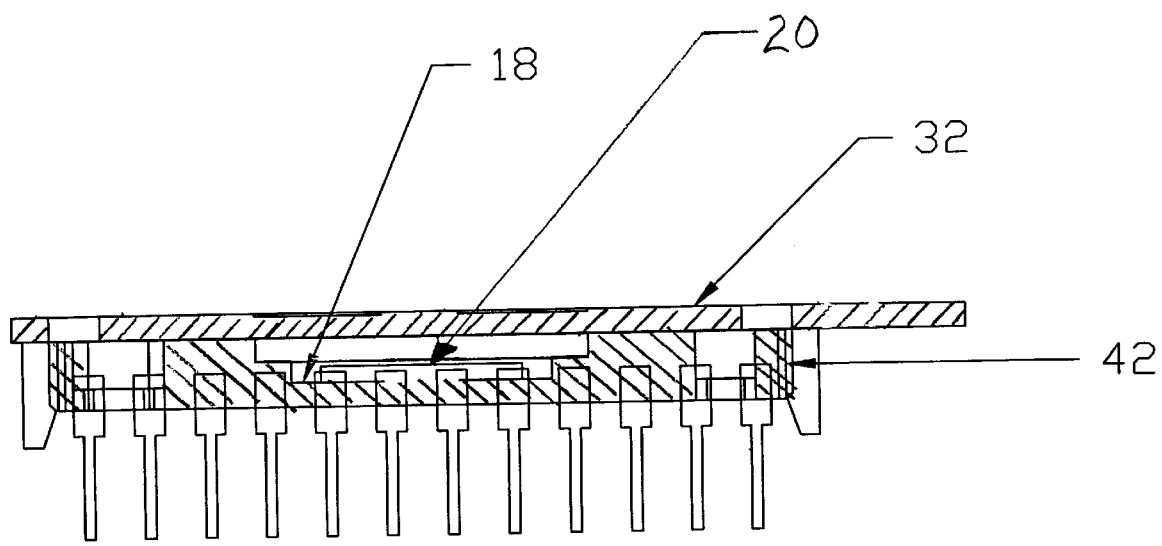
FIG. 3 is a cross-sectional view of the image sensor and cover assembly of FIG. 1 as taken along line 3—3 shown in the assembled position.
Figure 4:
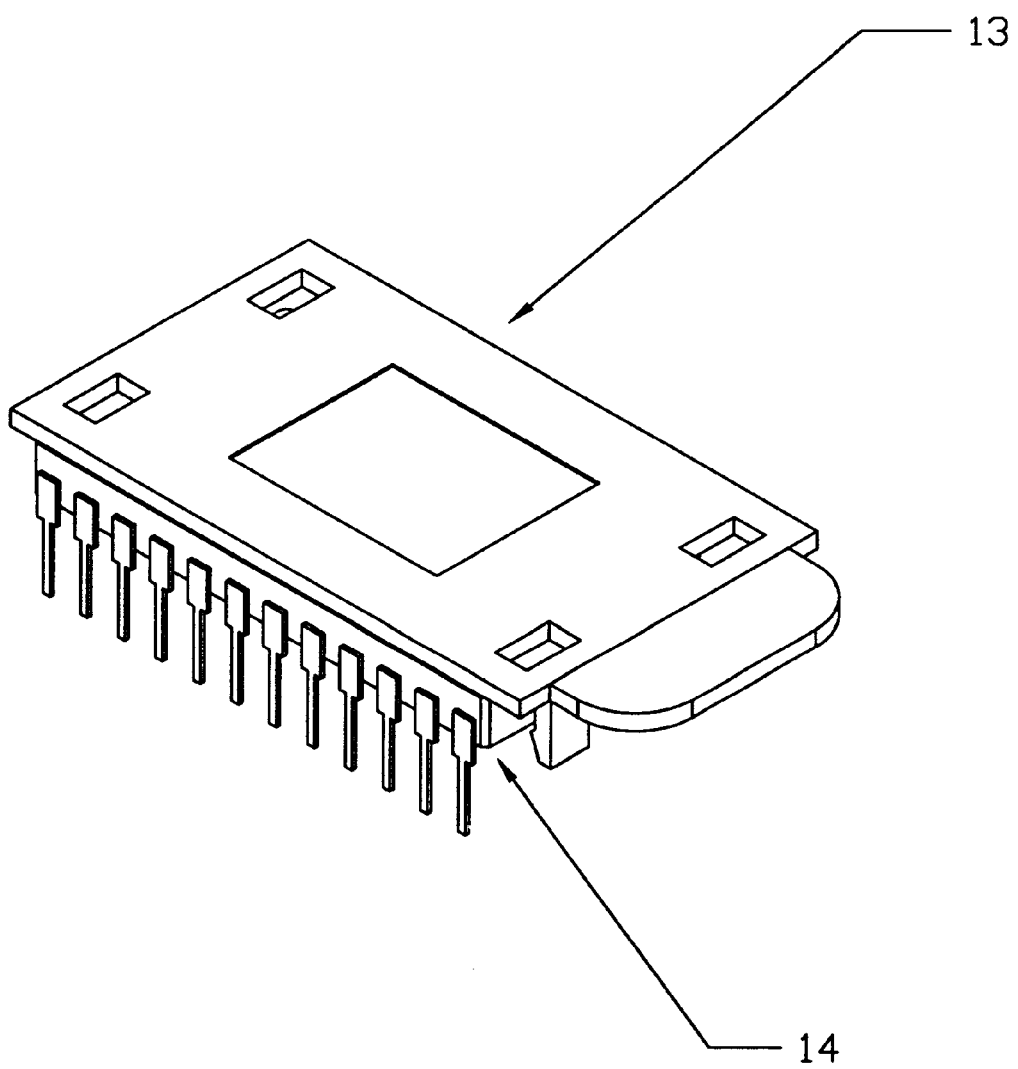
FIG. 4 is an isometrical view of the sensor and cover assembly of FIG. 1 shown in the assembled position.

The present description will be directed in particular to elements forming part of, or in cooperation more directly with, the apparatus in accordance with the present invention. It is understood that elements not specifically shown or described may take various forms well known to those skilled in the art.

Referring to the figures, there is illustrated a sensor and cover assembly 10 made in accordance with the present invention. The assembly 10 comprises a sensor assembly 12 and cover 13. The sensor assembly 12 includes a supporting substrate 14 having a generally planer upper surface 16. The sensor substrate 14 is configured so as to provide a recessed cavity section 18 in which a sensor 20 is mounted in such that the sensor 20 is below the planer upper surface 16. The substrate 14 may be made of any typical material currently used or may be used in the future. The sensor assembly 12 further includes a plurality of electrical leads 22 which are used to mount the sensor mounting assembly 12 to a circuit board, not shown, in the manner typically used in the prior art and provide electrical connection to sensor 20. In the particular embodiment illustrated, sensor 20 is an area array charged couple device (CCD) image sensor for capturing of images that are exposed onto the sensor. A suitable example of a sensor mounting assembly is illustrated by Kodak KAF-0400 part # 5B7005 which is commercially available. However, it is to be understood that sensor 20 may comprise of any other image sensor or other type of substrate if so desired.

The cover 13 which is designed to be easily and quickly mounted to or removed from the sensor mounting assembly 12. In the particular embodiment illustrated, the cover 13 comprises a body 32 which is substantially planer and is provided with a plurality of flexible mounting projections 34 which extend from the body 32. Each of the mounting projections terminate in a terminal end 36 having an engaging surface 38 which is designed to engage the lower surface 40 of supporting substrate 14. The cover 13 is preferably made of a plastic material which is suitable for molding and has good optical properties, polycarbonate or acrylic plastic, are but a couple representative examples of suitable material for cover 13. In the particular embodiment illustrated, the cover 13 is made by typical mold injecting techniques as is well know in the prior art. The mounting projections 34 have size and shape such that there is provided a predetermined amount of flexibility which allows the projecting members 34 to flex a sufficient distance, which allows it to snap over the sides 42 of the supporting substrate 14, yet allow the engaging surface 38 to engage the bottom surface 40 of substrate 14 when properly seated thereon. This provides secure mounting of the cover 13 to substrate 14. In the particular embodiment illustrated, the mounting projections 34 each have a thickness T of about 0.045 inches, a length extending from the body to the engaging surface L of about 0.176 inches and a width W of approximately 0.080 inches. However, it is to be understood that these dimensions may be varied as appropriate for the selection of the size of the cover and the degree of flexibility necessary or desired to provide the appropriate degree of locking of the cover 13 on the substrate 14 yet have sufficient flexibility to allow the cover to be easily removed and place the body 32 adjacent to the top surface 16 of substrate 14.

The cover 13 is provided with a window area 44 which is designed to preferably have optical qualities for allowing light to pass through the cover in much the same way as a glass cover would be provided over the substrate 14. The size of the window area 44 is designed to allow all areas of the sensor 20 to be properly exposed by an operating or by an exposing light source. In the particular embodiment illustrated, the window area 44 has a length Lw and width Ww which is slightly larger than the length LS with LW of the sensor 20.

The cover 13 in the preferred embodiment illustrated is provided with a projecting tab 46 which extends axially outward from the body 32 so as to extend beyond the substrate 14 so as to allow the finger of an individual to pull the cover 13 away from the sensor 20 such that the mounting projection 34 will easily disengage from the supporting substrate 14.

As previously mentioned, the window area 44 is of an optical quality. Therefore, the cover 13 is made out of a plastic material having an appropriate index of refraction and light transmittence. In the particular embodiment illustrated, the cover 13 is made out of a clear thermoplastic material, for example, a polycarbonate or acrylic plastic, preferably having a index of refraction of approximately 1.49 and a minimum light transmittence of about 90 percent. The window area is appropriately polished such that the following optical properties of the window area are obtained. The optical properties of the material of cover 13 is such that appropriate testing and use of the sensor 20 may conducted while the cover 13 is mounted to the substrate 14.

Preferably, the thickness T of the body 32 is minimized for any potential degradation of exposing light onto the sensor 20. Additionally, the surface flatness of the upper and lower surfaces 33 and 35 of the cover 13 is substantially flat. Preferably less than 0.003 inches of variation. In the particular embodiment the surface flatness of the window area is approximately 0.002 inches. The upper surface 37 of the substrate adjacent the cover 13 is also substantially flat. The flatness insures that a minimal amount of microscopic dust can travel between the cover 13 and the substrate 14. As previously discussed, the mounting properties are designed so that the body is securely seated on the upper surface 16 of substrate 14.

The providing of the optical window area 44 reduces any distortion of the image of light traveling through the cover 13. The material from which the cover 13 is made is also preferably of a non-static type to minimize any potential of electrostatic discharge to the sensor 20. In order to better understand the present invention, a brief discussion of its use will now be discussed.

Initially, a sensor assembly 12 is provided with a cover 13 mounted thereto such that the window area 44 is in alignment with the sensor 20 there below. The cover 13 is securely attached to the substrate 14 such that there is substantially no movement therebetween. The sensor and cover assembly 10 is placed either in a test fixture or in the product prior to final assembly at which time any required tests are conducted on the sensor 20 to determine any potential flaws that may exist in the sensor 20 and provide any appropriate calibration that may be required. After all initial testing and calibration have been conducted, the cover 13 may be removed and final assembly of the product may continue. However, optionally the cover 13 may be retained thereon allowing use of the sensor assembly 12 with the cover 13 directly thereon.

Additionally, should it become necessary to replace the cover 13 due to inadvertent damage, for example, scratching of the surface of the cover 13 during installation. The cover 13 is simply removed by placing a finger at tab 46 and lifting therefrom and then snapping on a new cover 13 on to sensor assembly 12 so as to allow continued use thereof.

Thus, it can be seen that the present invention provides a quick and economical way of providing protection to an image sensor mounted on a substrate without introducing any foreign material and which allows normal use or testing of the sensor.

It is to be understood that the various changes and modifications may be made without departing from the scope of the present invention. For example, various other materials may be used for manufacturing of the cover and other attachment techniques may be used for attaching of the cover to the substrate. Additionally, configuration of the window may be modified as desired to accommodate the needs of the sensor.

The invention has been described in detail with particular references to certain preferred embodiments thereof, but it will be understood that variations and modifications can be effected within the scope of the invention.

PARTS LIST 10 cover assembly
12 sensor assembly
13 cover
14 substrate
16 upper surface of substrate
18 recessed cavity section of substrate
20 sensor
22 electrical leads
32 body of cover
33 upper surface of cover
34 mounting projections of cover
35 lower surface of cover
36 terminal end of cover
38 engaging surface of cover
40 lower surface of substrate
42 sides of substrate
44 window area of cover
46 tab of cover

What is claimed is:

1. A cover for protecting an image sensor mounted on a supporting substrate, said substrate having a generally planer surface, said image sensor being mounted below said generally planer surface, said cover comprising:

a body extending over said image sensor and having means for removably mounting and demounting said cover from said substrate, said body having a window area such that use and/or test of said sensor may occur when the cover is mounted to said substrate.

2. A cover according to claim 1 wherein said means for removably mounting and demounting said cover comprises at least two flexible projecting members disposed at opposite sides of said cover, said members each having a portion designed to engage opposite sides of said substrate so as to secure said cover to said substrate.

3. A cover according to claim 2 wherein said body further comprises a projecting tab for allowing easy removal of said cover from said substrate.

4. A cover according to claim 1 wherein said window has an index of refraction of about 1.49 and a minimum light transmittence of about 90 percent.

5. A cover according to claim 1 wherein said cover is made out of a clear thermoplastic.

6. A cover according to claim 1 wherein said window area has a substantially uniform thickness.

7. A cover according to claim 1 wherein said cover made out of a non-static plastic material.

8. A cover according to claim 1 wherein said sensor is an area CCD.

9. A cover according to claim 1 wherein said body has a substantially uniform thickness and a substantially flat.

10. A cover according to claim 9 wherein said cover has a flatness is less than about 0.003 inches.

11. A cover according to claim 9 wherein said substrate having an upper surface adjacent said cover, said upper surface being substantially flat.

12. A method of testing and/or use of an image sensor provided in a supporting substrate, comprising:

providing a supporting substrate having a general planer upper surface and an image sensor mounted to said supporting substrate below said upper surface;

providing a removable cover for engagement with said supporting substrate, said cover extending over said image sensor, said cover having a body having a window such that use and/or test of said sensor may occur through said window when the cover is mounted to said substrate, and;

subjecting said image sensor to optical use and/or testing through said window.

13. A method according to claim 12 wherein said substrate is mounted on a product prior to final assembly of said product.

14. A method according to claim 12 further comprises step of removing said cover.

15. A method according to claim 13 further comprising the step of finally assembling the product so as to enclose said sensor array in said product.

16. A sensor and cover assembly comprising sensor having a supporting substrate having a generally planer upper surface and an image sensor mounted to said substrate below said upper surface, and a cover for positioning on said upper surface for protection of said image sensor, said cover comprising:

a body extending over said image sensor and having at least one mounting member for removably mounting and demounting said cover from said substrate, said body having a window area positioned with respect to said sensor such that use and/or test of said sensor may occur through said window when the cover is mounted to said substrate.

17. A sensor and cover assembly according to claim 16 wherein said at least one mounting member for removably mounting and demounting said cover comprises at least two flexible projecting members disposed at opposite sides of said cover, said members each having a portion designed to engage opposite sides of said substrate so as to secure said cover to said substrate.

18. A cover according to claim 17 wherein said body further comprises a projecting tab for allowing easy removal of said cover from said substrate.

19. A sensor and cover assembly according to claim 16 wherein said window has an index of refraction of about 1.49.

20. A sensor and cover assembly according to claim 16 wherein said cover is made out of a clear thermoplastic.

21. A sensor and cover assembly according to claim 16 wherein said window area has a substantially uniform thickness.

22. A sensor and cover assembly according to claim 16 wherein said cover made out of a non-static plastic material.

23. A sensor and cover assembly according to claim 16 wherein said sensor is an area CCD.

24. A sensor and cover assembly according to claim 16 wherein said body has a substantially uniform thickness and a substantially flat.

25. A sensor and cover assembly according to claim 24 wherein said cover has a flatness is less than about 0.003 inches.

26. A sensor and cover assembly according to claim 24 wherein said substrate having an upper surface adjacent said cover, said upper surface being substantially flat.

\* \* \* \* \*